United States Patent [19]

Shinozaki

[11] Patent Number: 5,631,119
[45] Date of Patent: May 20, 1997

[54] IMAGE-FORMING MATERIAL AND IMAGE FORMATION PROCESS

[75] Inventor: Fumiaki Shinozaki, Shizuoka, Japan

[73] Assignee: Fuji Photo Film Co., Ltd., Kanagawa, Japan

[21] Appl. No.: 585,412

[22] Filed: Jan. 11, 1996

Related U.S. Application Data

[62] Division of Ser. No. 281,688, Jul. 28, 1994, abandoned.

[30] Foreign Application Priority Data

Jul. 29, 1993 [JP] Japan .................................. 5-188034
Jul. 29, 1993 [JP] Japan .................................. 5-188035

[51] Int. Cl.⁶ .............................. G03F 7/26; G03F 7/023
[52] U.S. Cl. ........................ 430/326; 430/166; 430/191; 430/192; 430/303; 430/328; 430/330
[58] Field of Search .................................. 430/303, 330, 430/326, 191, 192, 166, 328

[56] References Cited

U.S. PATENT DOCUMENTS

| | | | |
|---|---|---|---|
| 4,853,313 | 8/1989 | Mori et al. ............................. | 430/303 |
| 5,200,292 | 4/1993 | Shinozaki et al. ...................... | 430/178 |
| 5,399,456 | 3/1995 | Spak et al. ............................. | 430/165 |

*Primary Examiner*—John S. Chu
*Attorney, Agent, or Firm*—Sughrue, Mion, Zinn, Macpeak & Seas

[57] ABSTRACT

The present invention provides an image-forming material which comprises a support having thereon, in the following order, (1) a photosensitive composition layer comprising (a) an o-quinonediazide compound, and (b) an additive which reacts with a photoreaction product of the o-quinonediazide compound on heating to produce an alkali-insoluble matter, and (2) a water-soluble high molecular compound layer or a silicone rubber layer. The present invention also provides an image formation process which comprises exposing an entire surface of the image-forming material to light rays which render the o-quinonediazide compound soluble in an alkaline developer, imagewise heating the image-forming material, and then developing the image forming material with an alkaline developer to remove those areas which have not been heated. The present invention further provides an image-forming material which comprises a support having thereon a photosensitive composition layer comprising an o-quinonediazide compound and an additive comprising a group having a chemical structure represented by any one of formulas (1) to (7) shown in the specification and a maximum absorption wavelength in the range of from 670 to 1,250 nm selected from the group consisting of cyanine dye, azlenium dye, squarium dye, croconium dye, quinone dye, thiazine dye and zanthene dye, the additive reacts with a photoreaction product of the o-quinonediazide compound on heating to produce an alkali-insoluble matter, and the additive is contained in the photosensitive composition layer in an amount of from 0.03 to 0.7 parts by weight per part by weight of the o-quinonediazide compound.

11 Claims, No Drawings

IMAGE-FORMING MATERIAL AND IMAGE FORMATION PROCESS

This is a divisional of application Ser. No. 08/281,688 filed Jul. 28, 1994, abandoned.

FIELD OF THE INVENTION

The present invention relates to an image-forming material which enables digital recording by means of a thermal printer equipped with a thermal head or an infrared laser such as a semiconductor laser, and an image formation process using such an image-forming material. The image-forming material is advantageously employed as a direct digital plate from which high quality prints are readily made in a printing machine.

BACKGROUND OF THE INVENTION

In the field of printing, the demand is expected to grow for direct making of printing plates by digital recording. In order to meet this demand, methods have been proposed which comprise direct making of a printing plate by electrophotography, a silver salt diffusion transfer process, heat-sensitive digital recording using a thermal printer equipped with a thermal head or laser digital recording utilizing a technique for sensitizing photopolymer.

A known technique for direct making of a printing plate by a thermal head comprises transferring an image area onto a support having a hydrophilic layer with a thermal head by a melt transfer process to form a lipophilic image thereon, to thereby make a printing plate. However, it is difficult to place the printing plate prepared according to this method into practical use because it does not satisfy important requirements for a printing plate, such as good printability and good plate wear in printing machines.

It is well known that when irradiated with active light rays, an o-quinonediazide compound undergoes decomposition of a constituent diazo group and becomes a carboxyl-containing compound soluble in an alkali. Thus, when a photographic material comprising an o-quinonediazide compound is imagewise exposed to light and then developed with an alkaline developer, the exposed area is dissolved away with the developer while the unexposed area remains on the photographic material to form an image. This type of image recording material is called a positive-working image-forming material.

Furthermore, as described in JP-A-49-127615 (The term "JP-A" as used herein means an "unexamined published Japanese patent application"), JP-A-56-6236, JP-A-56-36648, JP-B-62-49613 (The term "JP-B" as used herein means an "examined Japanese patent publication"), JP-B-62-49614, and JP-B-62-49615, a photographic material having a photosensitive layer comprising a composition containing an o-quinonediazide compound as a photosensitive component and an additive such as an aliphatic amine, a N-alcoholamine, an aromatic ketone, a quinone compound, an imidazole compound and a basic carbonium compound can also subjected to negative-working processing. In some detail, this type of photographic material can be heated at the same time as or after imagewise exposure, uniformly exposed to light, and then developed to form a negative image.

On the basis of these known techniques, an image-forming material was prepared comprising on a support a photosensitive layer containing an o-quinonediazide compound as a first essential component and an additive which directly or catalytically reacts with a photoreaction product of the o-quinonediazide compound on heating to produce an alkali-insoluble matter as a second essential component. The image-forming material thus prepared was exposed on the entire surface thereof to light rays which are active to the o-quinonediazide compound, typed with a thermal head printer, and then developed with an alkaline developer to remove the untyped areas. As a result, an image was formed, but the photosensitive layer caused contamination of the head. This contamination made it difficult to place the image-forming material into practical use.

Furthermore, the above noted additives substantially do not absorb light in the visible range. If a dye or dyestuff which absorbs in the visible range could be used as an additive for reversing (negative working), printing plates and various images could be formed by laser digital recording without masking (i.e., by uniformly exposing the image-forming material to light rays which are active to o-quinonediazide compounds (i.e., render the o-quinonediazide compound soluble in an alkaline developer), and then patternwise (i.e., imagewise) irradiating the material with a high output argon laser or the like so that the laser beam is converted to heat that renders insoluble those areas irradiated with the laser beam.

JP-B-62-49615 discloses a technique based on such a concept. In some detail, a photographic material comprising on a support a photosensitive composition containing an o-quinonediazide compound as a photosensitive component and a basic carbonyl dye selected from the group consisting of diphenylmethane dye, triphenylmethane dye, xanthene dye and acridine dye as an additive for reversal is disclosed. The photographic material is exposed on the entire surface thereof to light rays which are active to o-quinonediazide compounds, patternwise irradiated with a laser beam such as an argon laser, and then developed with an alkaline developer to dissolve away those areas that were not irradiated with the laser beam. Thus, a negative-working image is formed.

However, a system based on this technique has never been commercially available. This is largely because its low photosensitivity made it necessary to use a large-sized water-cooled laser or a very low scanning speed.

In recent years, on the other hand, semiconductor lasers emitting infrared laser beams have made remarkable Progress-miniaturization, higher output, multibeam laser composed of several to scores of these high output lasers. The progress in these techniques has made the foregoing system practicable if the photosensitivity of the image-forming material is in the range of from 100 mW to 400 mW.

The above cited JP-B-62-49615 describes that an infrared laser beam such as a YAG laser (oscillation wavelength: 1.06 μm) can be used as well. However, basic carbonium dyes such as diphenylmethane dye, triphenylmethane dye, xanthene dye and acridine dye as reversing dyes for addition to the photosensitive composition include no coloring materials for converting light to heat which would be needed with use of an infrared laser. Thus, it is necessary to include an additive for converting light to heat in addition to the coloring material to effect reversal. This disadvantageously increases the amount of additives contained in the system, which results in deterioration of developability and image intensity.

SUMMARY OF THE INVENTION

It is a first object of the present invention to provide an image-forming material from which a direct printing plate having a good printability and a high impression capacity in printing machines can be prepared by a thermal printer employing a thermal head and an image formation process using such an image-forming material.

It is a second object of the present invention to provide an image-forming material having a good efficieny in light-heat conversion relative to exposure with an infrared laser beam and an image formation process using such an image-forming material.

It is a third object of the present invention to provide an image formation process that enables direct digital recording which can meet growing demand without masking by using the foregoing image-forming material.

These and other objects of the present invention will become more apparent from the following detailed description and Examples.

The first object of the present invention is accomplished in a first embodiment of the image-forming material of the present invention, which comprises a support having thereon, in the following order, (1) a photosensitive layer comprising (a) an o-quinonediazide compound and (b) an additive which reacts with a photoreaction product of the o-quinonediazide compound on heating to produce an alkali-insoluble matter, and (2) a water-soluble high molecular compound layer or a silicone rubber layer. The first object of the present invention is also accomplished by an image formation process which comprises exposing the entire surface of the image-forming material to light rays which render the o-quinonediazide compound soluble in an alkaline developer, imagewise heating the image-forming material, and then developing the image-forming material with an alkaline developer to remove those areas which have not been heated. The imagewise heating may be carried out with the thermal head of a thermal head printer.

In the lithographic printing system, a printing process with a dampening water and ink utilizing the difference between hydrophilicity and lipophilicity of the printing plate, and a printing process without a dampening water utilizing the difference between ink repellency and ink receptivity (dryography) are known. The first embodiment of the image-forming material according to the present invention enables a printing plate to be made using a dampening water and ink as well as a dryographic printing plate in a digital process using a thermal head printer, to thereby provide a considerable advance in the art.

The second object of the present invention is accomplished in a second embodiment of the image-forming material of the present invention, which comprises a support having thereon a photosensitive composition layer comprising (a) an o-quinonediazide compound and (b) an additive comprising a group having a chemical structure represented by any one of the following formulas (1) to (7) and having a maximum absorption wavelength ($\lambda_{max}$) in the range of from 670 to 1,250 nm selected from the group consisting of cyanine dye, azulenium dye, squalium dye, croconium dye, quinone dye, thiazine dye and xanthene dye, the additive reacts with a photoreaction product of the o-quinonediazide compound upon heating to produce an alkali-insoluble matter, and the additive is contained in the photosensitive composition layer in an amount of from 0.03 to 0.7 parts by weight based on the weight of the o-quinonediazide compound:

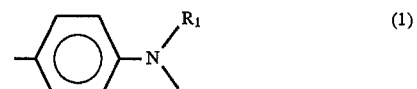

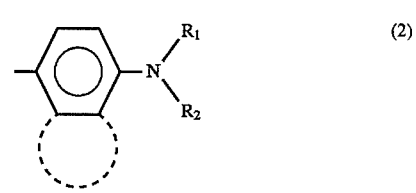

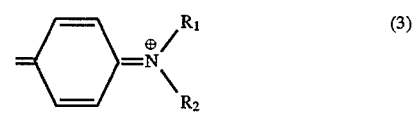

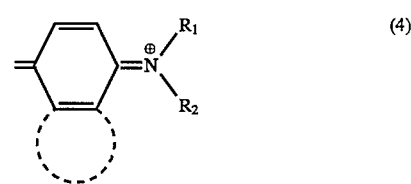

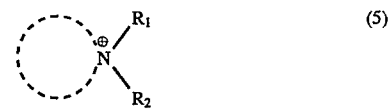

wherein $R_1$ and $R_2$, which may be the same or different, and each represent a hydrogen atom, a $C_1$–$C_{20}$ alkyl group, a $C_1$–$C_{20}$ alkoxy group, a $C_7$–$C_{20}$ aralkyl group or a $C_6$–$C_{20}$ aryl group. The second object of the present invention is also accomplished by an image formation process which comprises exposing the entire surface of the above described image-forming material to light rays which render the o-quinonediazide compound soluble in an alkaline developer, imagewise irradiating the image-forming material with an infrared laser beam, and then developing the image-forming material with an alkaline developer to remove those areas which have not been irradiated with a laser beam.

The manner of achieving the third object of the present invention is apparent from the following Examples, etc.

DETAILED DESCRIPTION OF THE INVENTION

The present invention is described in further detail below.

The support for the image-forming material of the present invention may be a planar substance or a substance having various shapes that undergo no marked dimensional change. Examples of such a planar substance include glass, silicon single-crystal plate, silicon oxide, ceramics, paper, metal (e.g., aluminum, magnesium, zinc, copper, iron, chromium, nickel, silver, gold, platinum, palladium, aluminum alloy, zinc alloy, magnesium alloy, copper-zinc alloy, iron-nickel-chromium alloy, copper alloy), polymer (e.g., regenerated cellulose, cellulose nitrate, cellulose diacetate, cellulose triacetate, cellulose acetate butyrate, cellulose acetate propionate, polyethylene terephthalate, polyethylene isophthalate, polycarbonate of bisphenol A, polystyrene, polypropylene, nylon (e.g., nylon 6, nylon 66, nylon 610), poly(vinyl chloride), vinyl chloride-vinyl acetate copolymer, vinyl chloride-acrylonitrile copolymer, vinyl chloride-vinylidene chloride copolymer, polyacrylonitrile, methyl polyacrylate, methyl polymethacrylate), and plastic film such as synthetic paper.

Furthermore, a rigid laminate of two or more thin sheets of the foregoing substances may be used. Examples of such a laminate include cermet, iron-aluminum laminate, iron-copper-aluminum laminate, iron-chromium-copper laminate, paper coated with polyethylene, cellulose triacetate, polypropylene, polyethylene terephthalate or the like, aluminum plate on which an aluminum oxide layer has been formed by anodic oxidation, synthetic paper or plastic on which a water receptive layer is formed, by a known method, chromium plate on which a chromium oxide layer has been formed glass plate on which a tin oxide layer is formed, and silicon oxide plate on which an indium oxide layer is formed.

The support may comprise a transparent or opaque material depending on the intended application of the image-forming material. In the case of a transparent material, colorless transparent materials as well as transparent materials colored with a dye or pigment as described in *J. SMPTE*, vol. 67, page 296 (1958) may be used.

In the case of opaque supports, in addition to inherently opaque materials such as paper and metal, transparent materials comprising a dye or pigment such as titanium oxide incorporated therein, plastic films which have been surface-treated by a method described in JP-B-47-19068, and paper or plastic films which have been rendered fully light-screening with carbon black or the like may be used.

Furthermore, a support which has been subjected to treatment such as graining, electrolytic etching, anodic oxidation and chemical etching to form fine unevenness thereon, a support which has been subjected to pretreatment such as corona discharge, irradiation with ultraviolet rays and flame treatment, or a plastic support reinforced with a reinforcing agent such as glass fiber, carbon fiber, boron fiber, various metallic fibers and metallic whisker may be used.

As necessary, the support may comprise a coating layer for strengthening adhesion to the photosensitive resin composition layer, anti-halation layer, ultraviolet-absorbing layer, visible light-absorbing layer or the like formed on the surface thereof.

In the case where a printing plate utilizing the difference between hydrophilicity and lipophilicity is produced, the surface of such a support is necessarily made water-wettable or provided with a water receptive layer.

The photosensitive layer of the image-forming material is described below. In both the first and second embodiments of the image-forming material of the present invention, the photosensitive layer comprises o-quinonediazide as a first component.

The o-quinonediazide compound for use in the present invention is a compound having at least one o-quinonediazide group in its molecule which is rendered soluble (or is increased in solubility) in an alkaline solution upon exposure to actinic light. Such an o-quinonediazide compound is known in the art and is described, e.g., in J. Kosar, *Light-Sensitive System*, John Wiley & Sons Inc., 1965. In particular, sulfonic esters of various hydroxyl compounds with o-benzo-quinonediazide or o-naphtho-quinonediazide are preferred. Typical examples of such sulfonic esters include 2,2'-dihydroxydiphenyl-bis-[naphtho-quinone-1,2-diazido-5-sulfonic ester], 2,2',4,4'-tetrahydroxydiphenyl-tetra[naphtho-quinone-1,2-diazido-5-sulfonic ester], and 2,3,4-trioxybenzophenone-bis[naphthoquinone-1,2-diazido-5-sulfonic ester]. In particular, an ester of polyhydroxybenzene with naphtho-quinone-1,2-diazido-5-sulfonic acid obtained by the polycondensation of acetone and pyrogallol as described in JP-B-43-28403 can be used to advantage.

The additive (second component) in the first embodiment of the image-forming material of the present invention which directly or catalytically reacts with a photoreaction product of the o-quinonediazide compound to produce an alkali-insoluble matter includes the compounds described above as well as various other known compounds. Furthermore, compounds comprising a group having a chemical structure represented by the foregoing formulas (1) to (7) can be used.

The mixing proportion of the second component is preferably in the range of from 0.01 to 1 parts by weight, particularly 0.03 to 0.7 parts by weight per part by weight of the o-quinonediazide compound.

In addition to the foregoing essential components, various additives, e.g., coloring materials or printing agents for making an image visible, may be incorporated into the photosensitive composition for use in the first embodiment of the image-forming material of the present invention. Furthermore, in order to enhance image intensity or for use as a binding material, a known resin such as a phenol resin and a styrene/maleic acid copolymer resin may be incorporated into the photosensitive composition. Generally the weight ratio of the o-quinonediazide compound to the binder is from 1/1 to 0.15/1. These techniques are widely known to those skilled in the art.

In order to prepare the first embodiment of the image-forming material of the present invention, a photosensitive (resin) composition layer having the foregoing composition is provided on a support. As necessary, the photosensitive resin composition is used in the form of a solution in a solvent. The solvent may be suitably selected from known solvents which do not impair the photographic properties of the photosensitive composition. Application of the photosensitive composition or a solution thereof on the support can be accomplished by any proper known method. A typical method is to coat the support with the photosensitive composition in the form of a solution. Those skilled in the art can easily perform this process in accordance with a known method. The dry thickness of the photosensitive layer is generally in the range of from 0.3 to 3 µm, but varies depending on the intended application. In the case where a water-soluble resin layer (high molecular compound layer) is provided on the photosensitive layer, a known water-soluble resin there may be used. Examples thereof include poly(vinyl alcohol), poly(vinylpyrrolidone), various polyacrylamides, water-soluble celluloses such as hydroxyalkyl cellulose, starch, and ethylene oxide polymers. Such a water-soluble resin may comprise a particulate inorganic material such as silica and kaolin powder, a high molecular weight matting agent, or various known releasing agents incorporated therein. The dry thickness of the water-soluble resin layer is preferably in the range of from about 0.1 to 5 µm.

When a silicone rubber layer is provided for preparing a dryographic printing plate, the silicone rubber is preferably a linear or somewhat crosslinked organopolysiloxane. Such an organopolysiloxane generally has a molecular weight of about 1,000 to several hundred thousand. It is crosslinked to the extent that the silicone rubber remains liquid, waxy or rubbery at room temperature. Organosiloxanes are classified as condensation type or addition type depending on the crosslinking method employed.

A condensation type silicone rubber undergoes condensation reaction to release water, an alcohol, an organic acid, etc. Particularly useful examples of such condensation type silicone rubbers include a mixture of a linear organopolysiloxane having hydroxyl groups at both ends or in part of the principal chain and a silicone crosslinking agent, and the reaction product of a hydroxyl group with a silicone crosslinking agent.

An addition type silicone rubber is a product of the addition of a hydroxyl group in a crosslinking agent to an unsaturated group, e.g., vinyl group, in the main unit followed by the crosslinking of vinyl groups. Specifically, it is obtained from a mixture of a vinyl-containing organopolysiloxane, hydrogenated organopolysiloxane or the like with a platinum catalyst or the like.

The foregoing silicone rubber is commercially available. Examples thereof include condensation type silicone rubbers such as KE-41 and KE-42 available from Shin-Etsu Chemical Co., Ltd., YE-3085 and YE-3075 available from Toshiba Silicone Co., Ltd., and SH-781 and PRX-305 available from Toray Silicone Co., Ltd., and addition type silicone rubbers such as KE-103 and KE-1300 available from Shin-Etsu Chemical Co., Ltd., TSE-3032 available from Toshiba Silicone Co., Ltd., and SH-9555 available from Toray Silicone Co., Ltd.

The method for preparing an ink-repelling silicone rubber may be a method for preparing a deep-etch plate type water-disusing lithographic printing plate utilizing a silicone rubber layer. The formation of a silicone rubber layer on an aqualess lithographic printing plate can be accomplished by the techniques disclosed in JP-B-55-22781, JP-B-55-39825, JP-A-49-68803, JP-A-49-73202, JP-A-49-77702, JP-B-55-47383, JP-B-55-39826, JP-A-60-133452, JP-A-60-133453, JP-A-60-169852, JP-A-60-229031, JP-A-61-153655, JP-A-62-14155, JP-A-62-14156, JP-A-62-50760, JP-A-62-112162, JP-A-61-275759, JP-A-62-175759, JP-A-62-177559, JP-A-62-194255, JP-A-62-299854, JP-A-62-111254, JP-A-63-133153, JP-A-63-200155, JP-A-63-253949, JP-A-63-261352, JP-A-63-280250, JP-A-63-280251, JP-A-63-305360, JP-A-01-35547, JP-A-01118843, JP-A-01-159653, JP-A-01-172834, JP-A-01-179047, JP-A-01-214839, JP-A-01-235955, JP-A-01-235956, JP-A-01-237663, JP-A-01-237664, JP-A-01-257847, JP-A-01-297643, JP-A-02-34857, JP-A-02-79852, JP-A-02-216157, JP-A-02-220059, JP-A-02-220060, Jp-A-02-226248,JP-A-02-226249, JP-A-02-235064, JP-A-02-236550, JP-A-02-242255, JP-A-03-5756, JP-A-03-27043, JP-A-48-94503, JP-A-48-94504, JP-A-49-88607, JP-A-50-50102, JP-A-50-59102, JP-A-50-59103, JP-A-50-66304, JP-A-51-8003, JP-A-51-70004, JP-A-54-18305, JP-A-54-54702, JP-A-54-89805, JP-A-54-103103, JP-A-54-130203, JP-A-55-26576, JP-A-55-26577, JP-A-55-55343, JP-A-55-59466, JP-A-55-60947, JP-A-55-70846, JP-A-55-84939, JP-A-55-89842, JP-A-55-110249, JP-A-55-124149, JP-A-55-156947, JP-A-55-161244, JP-A-55-159441, JP-A-56-25740, JP-A-56-27150, JP-A-56-43642, JP-A-56-62253, JP-A-56-80046, JP-A-56-80047, JP-A-57-13448, JP-A-57-23941, JP-A-57-124734, and JP-A-57-129442.

The thickness of the foregoing silicone rubber layer is preferably in the range of from 0.3 to 3 µm. For the purpose of enhancing the adhesion of the o-quinonediazide-containing photosensitive layer to the silicone rubber layer, an adhesion improver such as an aminosilane coupling agent may be incorporated into the photosensitive layer.

The first embodiment of the image-forming material of the present invention thus formed is then exposed to light rays which render the o-quinonediazide compound soluble in an alkaline developer (normally near ultraviolet rays or visible rays having a wavelength of about 290 to 500 nm) on the entire surface thereof (i.e., blanket exposure) by an ordinary method. The source of the actinic light may be a mercury vapor lamp, a xenon lamp, a carbon-arc lamp, a tungsten lamp, a fluorescent tube, sunlight, etc.

The thermal head printer for imagewise heating may be a commercial product without particular limitation. A heat transfer process thermal printer using a sublimable dye is particularly preferred. A variable dot size thermal printer to produce a half tone image may be used as well. Furthermore, the present invention can be applied to the formation of various resist images.

The image-forming material thus processed is then subjected to development.

The developer for use in development can be selected from many known developers for use in the development of a photosensitive layer comprising an o-quinonediazide compound. In some detail, development can be easily effected by dipping the image-forming material in an alkaline solution or washing the image-forming material with an alkaline solution. Preferred examples of such an alkaline solution include an aqueous solution containing an inorganic compound such as sodium hydroxide, potassium hydroxide, sodium silicate, potassium silicate, trisodium phosphate, tripotassium phosphate, sodium carbonate and potassium carbonate, and an aqueous solution containing an organic base such as ethanolamine, diethanolamine, triethanolamine and tetramethylammonium hydroxide. If necessary, the developer may contain an organic solvent, surface active agent, etc.

Examples of such an organic solvent include benzyl alcohol, cellosolves, and polyhydric alcohols such as ethylene glycol and polyethylene glycol.

The second embodiment of the image-forming material of the present invention is further described below.

The photosensitive layer comprises a photosensitive resin composition containing the same o-quinonediazide compound as described above as a first component and the foregoing reversing additive as a second component. As necessary, the photosensitive layer may further comprise a binder polymer.

The coloring material (i.e., the second component of the photosensitive layer) which serves as an additive for reversal of the photosensitive layer and which absorbs infrared rays to convert light to heat (i.e., directly or catalytically reacts with a photoreaction product of the o-quinonediazide compound to enable efficient production of an alkali-insoluble matter) includes a dye comprising a group having a chemical structure represented by the foregoing formulas (1) to (7) and having a $\lambda_{max}$ ranging from 670 nm to 1,250 nm selected from the group consisting of cyanine dye (including cyanine, hemicyanine, streptocyanine), azlenium dye, aquarium dye, croconiumdye, naphtho-quinone dye, anthraquinone dye, xanthene dye, oxazine dye and thiazine dye.

Specific examples of such a dye include the following compounds:

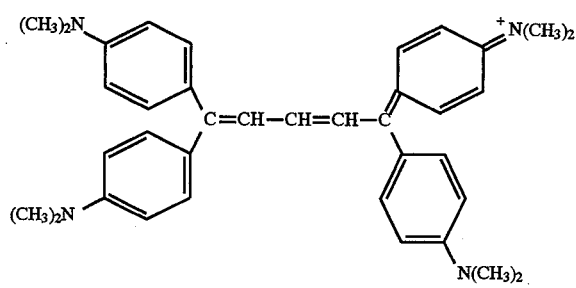

BF$_4^-$
No. 1
λmax 810 nm

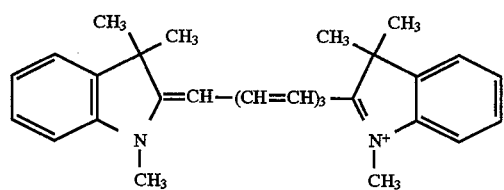

ClO$_4^-$
No. 2
λmax 755 nm

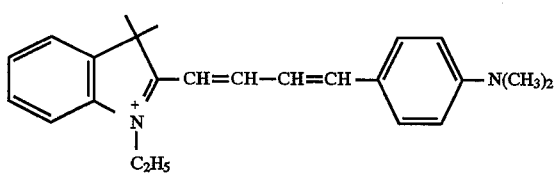

ClO$_4^-$
No. 3
λmax 730 nm

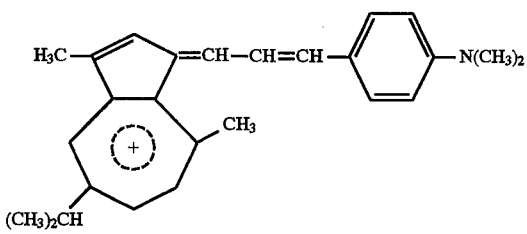

ClO$_4^-$
No. 4
λmax 728 nm

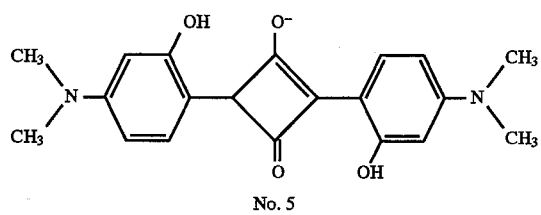

No. 5
λmax 700 nm

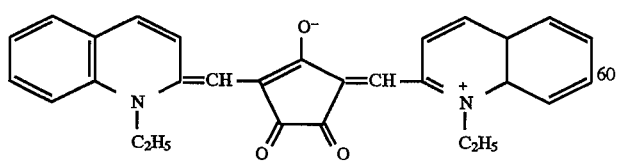

No. 6
λmax 809 nm

-continued

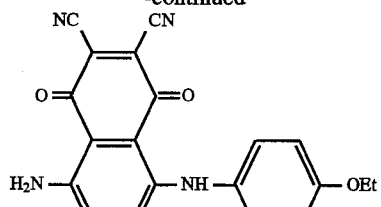

No. 7
λmax 774 nm

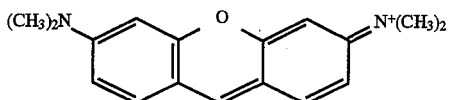

ClO$_4^-$
No. 8
λmax 720 nm (600 nm)

Among these dyes, those which undergo significant photodecoloring upon entire exposure of the image-forming material exhibit a poor light-heat conversion efficiency upon irradiation with infrared laser and thus are undesirable.

The inventors analyzed the mechanism of formation of a reversal image using an o-quinonediazide compound and consider that the following reaction takes place:

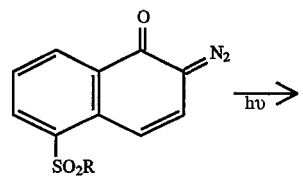

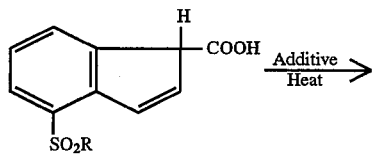

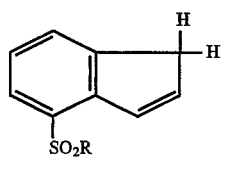

(Alkali-insoluble)

The mixing proportion of the foregoing coloring material is preferably in the range of from 0.01 to 1 parts by weight, particularly 0.03 to 0.7 parts by weight per part by weight of o-quinonediazide compound.

Besides the foregoing essential components, various additives may be incorporated into the photosensitive composition for use in the second embodiment of the image-forming material of the present invention. Furthermore, in order to enhance the image intensity or for use as a binding material, a known resin such as a phenol resin and a styrene/maleic acid copolymer resin may be incorporated into the photosensitive composition. These techniques are widely known to those skilled in the art.

For the method for preparation of an image-forming material, thickness of the photosensitive layer, etc., those described with reference to the first embodiment of the image-forming material of the present invention can be applied.

The image-forming material thus prepared is then exposed to light rays which render the o-quinonediazide compound soluble in an alkali solution on the entire surface thereof.

The infrared laser for use in the subsequent patternwise exposure includes a semiconductor laser, an YAG laser, a carbon dioxide gas laser or the like. From the standpoint of image quality, a short wavelength laser is desirable. In this respect, a semiconductor laser is desirable. A long wavelength laser light may be converted to a short wavelength laser light through a second harmonic generator before use.

The development of the second embodiment of the image-forming material of the present invention can be accomplished with the same developer as described above in connection with the first embodiment of this invention.

The image thus obtained can be used for many purposes. For example, it can be used with a grained aluminum substrate as a support. After development, such a laminate can be subjected to printing in a printing machine to provide an excellent printed matter. Alternatively, a photosensitive layer containing a dye of the present invention can be provided on a transparent plastic film such as a polyester film to provide a material for proofing of printing.

The second embodiment of the image-forming material of the present invention thus developed can then be subjected to posttreatment depending on its intended application. For example, if the image-forming material comprises a chromium film deposited on a glass substrate as a support, development may be followed by etching the chromium film with a known etching solution containing feric ion or the like with a photosensitive layer as an etching resist and subsequent removal of the resist to provide a hard mask. If the image-forming material comprises a silicon substrate as a support, it can be used as an etching resist for silicon oxide film or in a liftoff process. Moreover, if the image-forming material comprises a copper foil substrate for a print-wiring board as a support, it can be used as an etching resist or plating resist after development.

In the foregoing embodiment of the present invention wherein a laser is used for image recording, the image-forming material of the present invention can be used as a photomask, a laser recording material for a computer output signal, a facsimile terminal recording material, etc.

In addition to these applications, the image-forming material of the present invention can be used to prepare a video disc, etc. The image obtained according to the present invention is not limited to the applications mentioned above.

The second embodiment of the image-forming material of the present invention can be imagewise exposed to light, heated on the entire surface thereof, and then developed with an alkaline developer to form a reversal image thereon. Furthermore, the second embodiment of the image-forming material of the present invention can be exposed to light on the entire surface thereof, subjected to typing (e.g., imagewise heating) with a heat-sensitive printer using a thermal head, and then processed with an alkaline developer to remove untyped areas to form an image thereon.

The present invention is described in further detail in the following Examples, but the present invention should not be construed as being limited thereto.

EXAMPLE 1

On a 175-µm gelatin-undercoated polyester film was provided a 1.0-µm hardened hydrophilic layer comprising 1 part by weight of gelatin, 0.3 parts by weight of poly (vinylpyrrolidone) (PVK-K90 available from Wako Pure Chemical Industries, Ltd.) and 0.2 parts by weight of colloidal silica (Snowtex 40, available from Nissan Chemical Industries, Ltd.). Onto the hydrophilic layer was then coated a photosensitive solution comprising 1 part by weight of the 1,2-naphtho-quinonediazido-5-sulfonic ester of polyhydroxybenzene obtained by the polycondensation of acetone and pyrogallol as described in Example 1 of JP-B-43-28403, 2 parts by weight of a phenolic resin (PR-50904 available from Sumitomo Durez; polymerization degree: 3 to 10), 0.20 parts by weight of a reversing additive having the following chemical structure:

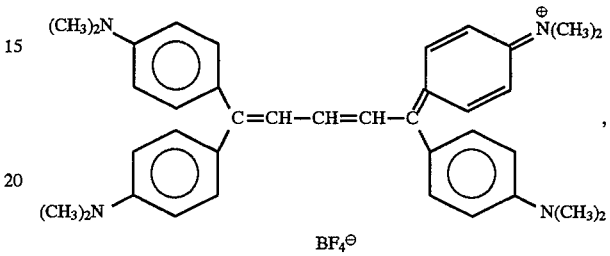

20 parts by weight of methyl ethyl ketone and 20 parts by weight of methyl cellosolve acetate to a dry thickness of 1.0 µm by means of a whirler.

Onto the photosensitive layer was then coated a solution comprising 2 parts by weight of poly(vinyl alcohol) (Poval 205, available from Kuraray Co., Ltd.), 1.5 parts by weight of colloidal silica (Snowrex 40, available from Nissan Chemical Industries, Ltd.), 0.2 parts by weight of a surface active agent (Surflon S-131, available from Asahi Glass Co., Ltd.) and 40 parts by weight of water to a dry thickness of 0.7 µm by means of a whirler to prepare an image-forming material.

The image-forming material thus prepared was exposed on the entire surface thereof (i.e., the frontside comprising the photosensitive layer and water-soluble resin layer) to light from a 2 kw ultrahigh pressure mercury vapor lamp positioned 55 cm apart therefrom for 30 seconds, typed (imagewise heated) using a thermal head printer for a rainbow proofer (available from 3M), and then developed with developer DP-1 for positive PS plates available from Fuji Photo Film Co., Ltd. to remove the water-soluble resin layer and the photosensitive layer on the untyped areas. The image-forming material thus processed was then subjected to printing in an offset printing machine. As a result, the image on the typed areas was well inked, and an excellent printed matter corresponding to the type was obtained.

EXAMPLE 2

The same procedure was effected as in Example 1, except that 0.20 parts by weight of 2-(o-chlorophenyl)-4,5-diphenylimidazole dimer was used as the reversing additive. As a result, an excellent printed matter was obtained as in Example 1.

EXAMPLE 3

The same procedure was effected as in Example 1, except that a solution having the following composition was coated onto the photosensitive layer comprising an o-quinonediazide compound in place of the water-soluble resin layer by means of a whirler, and then dried at a temperature of 120 ° C. for 2 minutes to form a 1-µm thick layer thereon. The image-forming material thus prepared was exposed to light on the entire surface thereof in the same manner as in Example 1, typed in a reverse mode by means of the above described thermal printer, and then developed with a solution having the following composition to remove the silicone rubber on the untyped area and the o-quinonediazide compound-containing photosensitive layer.

| Coating Solution | |
| --- | --- |
| Silicone Rubber (YE3085 available from Toshiba Silicone Co., Ltd.) | 3 g |
| n-Heptane | 30 g |
| Toluene | 30 g |
| Developer | |
| Sodium hydroxide | 4 g |
| Tribasic sodium phosphate | 10 g |
| Ethylene glycol | 100 g |
| Water | 1 l |

The image-forming material thus processed was mounted on an ordinary offset printing machine where it was then subjected to printing with a commercially available dryographic ink. As a result, an excellent printed matter was obtained.

EXAMPLE 4

The same procedure was effected as in Example 3, except that 0.20 parts by weight of the compound of Example 2 was used in place the reversing additive of Example 3. As a result, an excellent printed matter was obtained as in Example 3.

EXAMPLE 5

Onto a 100-μm thick polyethylene terephthalate film on which aluminum and iron had been vacuum-deposited in an atomic proportion of 98.5:1.5 to a thickness of 100 nm were each coated 8 kinds of photosensitive solutions comprising 1 part by weight of the 1,2-naphtho-quinonediazido-5-sulfonic ester of polyhydroxybenzene obtained by the polycondensation of acetone and pyrogallol as described in Example 1 of JP-B-43-28403, 2 parts by weight of a phenolic resin (PR-50904 available from Sumitomo Durez; polymerization degree: 3 to 10), 20 parts by weight of 1,2-dichloromethane, 20 parts by weight of methyl cellosolve acetate, and 0.2 parts by weight of exemplary compounds, dye Nos. 1 to No. 8 shown above to a dry thickness of 0.7 μm by means of a whirler to prepare 8 kinds of image-forming materials.

These 8 kinds of image-forming materials were each exposed on the entire surface thereof to light from a 2 kw ultrahigh pressure mercury vapor lamp positioned 55 cm apart therefrom for 30 seconds, and then subjected to recording with a semiconductor laser emitting an 830 nm infrared beam (LN981500PR available from Matsushita Electric Industrial Co., Ltd.) at an output of 99.9 mW, a scanning speed of 4.0 m/sec, a beam diameter of 10 μm, a scanning pitch of 5.0 μm and an intensity of 300 mW/cm$^2$ on the surface of the photographic material.

These image-forming materials were each dipped in a developer obtained by dissolving 4 g of sodium hydroxide, 10 g of sodium bromate and 10 g of sodium phosphate in 1 l of water at a temperature of 31 °C. for 20 seconds. As a result, the photosensitive layer and metal film were left on the laser beam-irradiated areas, while the metal film was eluted on the non-irradiated areas. Thus, an excellent image was obtained. From these results, it was confirmed that dye Nos. 1 to No. 8 can serve as additives for the formation of a reversal image.

EXAMPLE 6

A 2S aluminum plate for lithographic printing (aluminum alloy plate comprising 99 wt % aluminum, 0.6 wt % magnesium, and 0.4 wt % silicon) which had been mechanically grained was dipped in a 2 wt. % aqueous solution of sodium hydroxide maintained at a temperature of 40 °C. for 1 minute so that the surface thereof was etched. After rinsing, the aluminum plate was dipped in a mixture of sulfuric acid and chromic acid for about 1 minute to expose the surface of pure aluminum. The aluminum plate was then anodized in 20 wt % sulfuric acid maintained at a temperature of 30 °C. at a DC voltage of 15 V and a current density of 3 A/dm$^2$ for 2 minutes. The aluminum plate thus anodized was dipped in a 2.0 wt. % aqueous solution of sodium molybdate at a temperature of 65 °C. for 90 seconds, and then dried.

Onto the aluminum plate thus processed was coated a photosensitive solution containing dye No. 1 as prepared in Example 5 to a dry thickness of 1.0 μm by means of a whirler. The image-forming material thus prepared was subjected to entire exposure and image recording in the same manner as in Example 5, and then developed with a developer for a positive PS printing plate (DP-1, available from Fuji Photo Film Co., Ltd.) to form an image only on areas irradiated with a laser beam emitted from the semiconductor laser. Thereafter, the image-forming material thus processed was then subjected to printing in an ordinary offset printing machine. As a result, the image area was well inked, and an excellent printed matter corresponding to irradiation with laser light was obtained.

The first embodiment of the image-forming material of the present invention provides a printing plate well adapted for ordinary offset printing or dryography in a direct digital process only by typing with a thermal head printer.

Furthermore, the second embodiment of the image-forming material of the present invention provides an image that can be used for color proofing, printing plates, etc., in a direct digital process.

While the invention has been described in detail and with reference to specific embodiments thereof, it will be apparent to one skilled in the art that various changes and modifications can be made therein without departing from the spirit and scope thereof.

What is claimed is:

1. An image formation process, which comprises
   exposing an entire surface of an image-forming material which comprises a support having thereon, in the following order,
   (1) a photosensitive composition layer comprising
   (a) an o-quinonediazide compound, and
   (b) an additive which reacts with a photoreaction product of said o-quinonediazide compound on heating to produce an alkali-insoluble matter, and
   (2) a water-soluble high molecular compound layer or a silicon rubber layer,
   to light rays which render said o-quinonediazide compound soluble in an alkaline developer,
   imagewise heating the image-forming material, and then developing the image-forming material with an alkaline developer to remove those areas which have not been heated.

2. An image formation process, which comprises
   exposing the entire surface of an image-forming material which comprise a support having thereon a photosensitive composition layer comprising the following compounds (a) and (b):
(a) an o-quinonediazide compound; and
(b) a dye comprising a group represented by any of the following formulas (1) to (7) and having a maximum absorption wavelength between 670 nm and 1,250 nm selected from the group consisting of a cyanine dye, an azlenium dye, a squarium dye, a croconium dye, a quinone dye, a thiazine dye and a xanthene dye; wherein the dye reacts with a photoreaction product of said o-quinonediazide compound on heating to produce an alkali-insoluble matter, and the dye is contained in the photosensitive composition layer in an amount of from 0.03 to 0.7 parts by weight based on the weight of said o-quinonediazide compound:

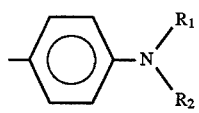 (1)

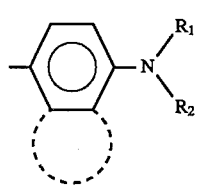 (2)

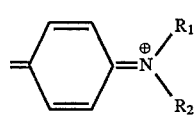 (3)

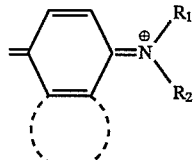 (4)

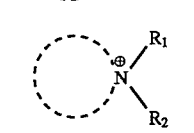 (5)

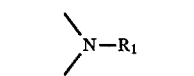 (6)

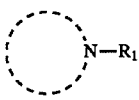 (7)

wherein $R_1$ and $R_2$ may be the same or different and each represent a hydrogen atom, an alkyl group, an alkoxy group, an aralkyl group or an aryl group;

to light rays which render said o-quinonediazide compound soluble in an alkaline developer, irradiating the image-forming material with an infrared laser beam, and then developing the image-forming material with an alkaline developer to remove those areas which have not been irradiated with the laser beam.

3. The image formation process according to claim 1, wherein (2) in the image-forming material is the water-soluble high molecular compound layer.

4. The image formation process according to claim 1, wherein (2) in the image-forming material is the silicone rubber layer.

5. The image formation process according to claim 2, wherein the dye in the image-forming material comprises the group represented by formula (1).

6. The image formation process according to claim 2, wherein the dye in the image-forming material comprises the group represented by formula (2).

7. The image formation process according to claim 2, wherein the dye in the image-forming material comprises the group represented by formula (3).

8. The image formation process according to claim 2, wherein the dye in the image-forming material comprises the group represented by formula (4).

9. The image formation process according to claim 2, wherein the dye in the image-forming material comprises the group represented by formula (5).

10. The image formation process according to claim 2, wherein the dye in the image-forming material comprises the group represented by formula (6).

11. The image formation process according to claim 2, wherein the dye in the image-forming material comprises the group represented by formula (7).

\* \* \* \* \*